United States Patent
Aldaz et al.

(10) Patent No.: US 8,471,280 B2
(45) Date of Patent: Jun. 25, 2013

(54) SILICONE BASED REFLECTIVE UNDERFILL AND THERMAL COUPLER

(75) Inventors: Rafael I. Aldaz, Pleasanton, CA (US);
Grigoriy Basin, San Francisco, CA (US); Paul S. Martin, Singapore (SG);
Michael Krames, Los Altos, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 384 days.

(21) Appl. No.: 12/613,924

(22) Filed: Nov. 6, 2009

(65) Prior Publication Data

US 2011/0108865 A1    May 12, 2011

(51) Int. Cl.
*H01L 23/29*    (2006.01)

(52) U.S. Cl.
USPC ............. 257/98; 257/788; 257/789; 257/791; 257/795; 257/E23.023

(58) Field of Classification Search
USPC ................... 257/788–789, 791, 795
See application file for complete search history.

(56) References Cited

U.S. PATENT DOCUMENTS

| | | | |
|---|---|---|---|
| 2003/0071568 A1 | 4/2003 | Lowery | |
| 2006/0018608 A1* | 1/2006 | Mizoguchi | 385/92 |
| 2006/0202223 A1* | 9/2006 | Sackrison et al. | 257/99 |
| 2008/0218759 A1 | 9/2008 | Colvin | |
| 2009/0057699 A1 | 3/2009 | Basin et al. | |
| 2009/0101929 A1 | 4/2009 | Mo | |
| 2009/0230409 A1 | 9/2009 | Basin | |
| 2010/0320479 A1* | 12/2010 | Minato et al. | 257/88 |

FOREIGN PATENT DOCUMENTS

| | | | |
|---|---|---|---|
| EP | 2216834 | 8/2010 | |
| JP | 2007019096 | 1/2007 | |
| WO | WO/2009/069671 | * | 6/2009 |

* cited by examiner

*Primary Examiner* — Marcos D. Pizarro
*Assistant Examiner* — Eva Yan Montalvo

(57) ABSTRACT

In one embodiment, a flip chip LED is formed with a high density of gold posts extending from a bottom surface of its n-layer and p-layer. The gold posts are bonded to submount electrodes. An underfill material is then molded to fill the voids between the bottom of the LED and the submount. The underfill comprises a silicone molding compound base and about 70-80%, by weight, alumina (or other suitable material). Alumina has a thermal conductance that is about 25 times better than that of the typical silicone underfill, which is mostly silica. The alumina is a white powder. The underfill may also contain about 5-10%, by weight, $TiO_2$ to increase the reflectivity. LED light is reflected upward by the reflective underfill, and the underfill efficiently conducts heat to the submount. The underfill also randomizes the light scattering, improving light extraction. The distributed gold posts and underfill support the LED layers during a growth substrate lift-off process.

19 Claims, 6 Drawing Sheets

SILICONE BASED REFLECTIVE UNDERFILL AND THERMAL COUPLER

FIELD OF THE INVENTION

This invention relates to light emitting diodes (LEDs) and, in particular, to providing a reflective and thermally conductive underfill between an LED and a mounting surface.

BACKGROUND

LEDs are typically mounted on a submount wafer that is later diced to separate out the individual LEDs/submounts. Each submount portion of the wafer has top electrodes that are bonded to electrodes on the LED, such as by ultrasonic bonding. An underfill material, such as epoxy or silicone, is then injected under the LED to provide mechanical support and protect the LED from contaminants.

The submount also has a set of more robust electrodes, electrically connected by a metal pattern to the LED electrodes, that are typically bonded to a printed circuit board (after the submount wafer is diced) using conventional solder reflow or other means.

It is known to provide large reflective metal electrodes, such as silver, on the bottom surface of an LED so that light emitted downward by the LED active layer is reflected upward rather than being absorbed by the submount. Forming such reflective metal electrodes can be complex. The preparation of the semiconductor surface, deposition and pattering of the silver mirror, and encapsulation with guard sheets to prevent metal intermixing or contamination can be a very complicated and delicate process that has to be closely monitored.

The LED can generate a lot of heat, and the heat may be conducted through the submount and into a heat sink. Most of the heat may be conducted through the LED metal electrodes to the submount. Silicone and epoxy underfill materials are poor conductors of heat.

What is needed is a better way to reflect light upwards from the surface of a submount and increase the removal of heat from the LED.

SUMMARY

A technique is described herein for forming a flip chip LED with a reflective underfill which provides good thermal conductivity between the LED and the submount.

To form the LED itself, conventional GaN-based layers (including AlInGaN, InGaN, etc.) or AlInGaP layers are grown over a growth substrate.

Then, for a GaN-based LED where the top p-layer is not very conductive, a transparent conductive oxide (TCO) layer of ITO, AZO, ZnO, MZO, GZO, AMZO, ZIO, or GMZO, for example, may be deposited over the top surface of the p-layer to help spread current. A transparent layer of gold can also be used. Portions of the TCO layer, p-layer, and active layer may then etched to expose distributed portions of the n-layer. The openings may then be filled with aluminum, Pt, or Ti, for example, to make electrical contact to the n-layer. Gold posts are then electroplated onto the metal n-contact (e.g., aluminum) to have a height such that the final thickness of the n-electrode will be at about the same height as the final p-electrode thickness (discussed below), such as 5 microns.

Reflective pads of silver or Pt, for example, are then patterned on the TCO layer over the p-layer, and the pads are electroplated with gold to form a high density array of gold posts having the same height as the gold posts formed over the aluminum. The gold posts may have a separation of about 50 microns or less and may have a diameter on the order of 10 microns or more. In some embodiments, the gold posts may have a separation of 30 microns or less and may have a diameter greater than 10 microns.

The LEDs are then singulated from the wafer and then mounted on metal electrodes of a submount wafer. The submount electrodes may be gold pads, and the LEDs may be mounted by ultrasonically welding the gold posts to the submount anode and cathode gold pads.

A silicone-based underfill is prepared. A conventional silicone molding compound (SMC) contains about 80% silica (by weight) for strength. In one embodiment of the invention, the silica (or a portion of it) is replaced with alumina ($Al_2O_3$), where the alumina is prepared using a well known process to make the alumina powder white under white light. Such alumina is commercially available. Silicone and silica have poor thermal conductivity, while alumina has much better thermal conductivity. The silicone loaded with about 70-80% (by weight) alumina will have good thermal conductivity. A small amount (e.g., 5-10% by weight) of the SMC content may be titanium oxide ($TiO_2$), a bright white powder, to increase the reflectance to as high as 96%. The SMC containing the alumina and $TiO_2$ not only reflects the light but randomizes the reflection to a greater extent than the prior art silver mirror electrodes.

The SMC may be filled with other materials having suitable reflective properties and thermal conductivities. The reflective properties may be that the materials are white or have a relatively high index of refraction. Such a suitable high index is greater than that of silicone, such as greater than 1.5. An overall reflectivity of the underfill of greater than 90% is preferred. A suitable thermal conductivity of the underfill is greater than 20 W/m/K.

The LEDs mounted on the submount wafer can then be subjected to a molding process where the SMC loaded with the alumina, and optionally $TiO_2$, is forced under pressure to fill in the voids between the LEDs and the submount. The SMC is then cured, and the submount wafer is removed from the mold. Excess SMC is then removed, such as from over the growth substrate.

The growth substrate can then be removed such as by laser lift-off, while the underfill and gold posts provide mechanical support for the thin LED layers.

The exposed n-layer surface can then be etched to roughen it for increasing light extraction.

The submount wafer is then diced to separate out the individual LEDs/submounts.

The many distributed gold posts in conjunction with the TCO layer distribute the current across the back surface of the p-layer. For an AlInGaP LED, the TCO layer is optional, and the gold posts may be plated over diffused metal regions in the p-layer. The spaces between the posts are filled with the reflective SMC so any downward light from the active layer is reflected upward and randomized for increased light extraction. The tops of the posts also reflect light upwards. The increased thermal conductivity SMC, in combination with the many gold posts, provide a good thermal conductivity path between the LED and the submount.

The above is just one embodiment of the invention, and other materials may be used.

BRIEF DESCRIPTION OF THE DRAWINGS

Elements that are the same or equivalent are labeled with the same numeral.

DETAILED DESCRIPTION

As a preliminary matter, a conventional LED is formed on a growth substrate. In the example used, the LED is a GaN-based LED, such as an AlInGaN or InGaN LED, for producing blue to green light. Other types of LEDs that can be used in the present invention include AlInGaP LEDs, which can produce light in the red to yellow range.

Figure 1:
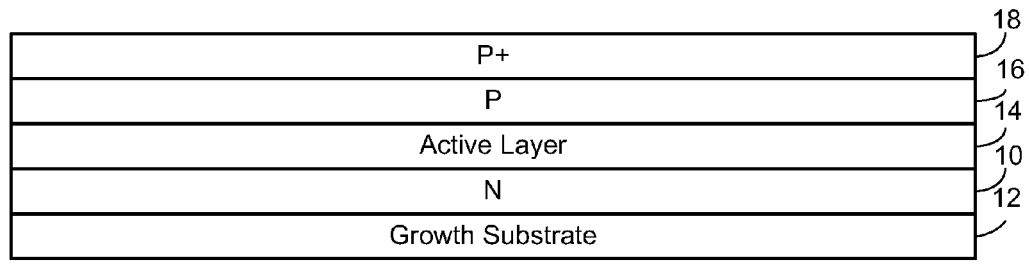
FIG. 1 is a cross-sectional view illustrating a small portion of a prior art wafer on which LED layers are grown.

As shown in FIG. 1, for a typical GaN LED, a relatively thick n-type GaN layer 10 (n-layer 10) is grown on a sapphire growth substrate 12 using conventional techniques. The relatively thick n-layer 10 typically includes a low temperature nucleation layer and one or more additional layers so as to provide a low-defect lattice structure for the n-type cladding layer and active layer. One or more n-type cladding layers (shown as being included in the n-layer 10) are then formed over the thick n-type layer, followed by an active layer 14, one or more p-type cladding layers 16, and a more heavily doped p-type contact layer 18 (to aid in the formation of a metal ohmic contact). The conductivities of the materials may be reversed.

Figure 12:
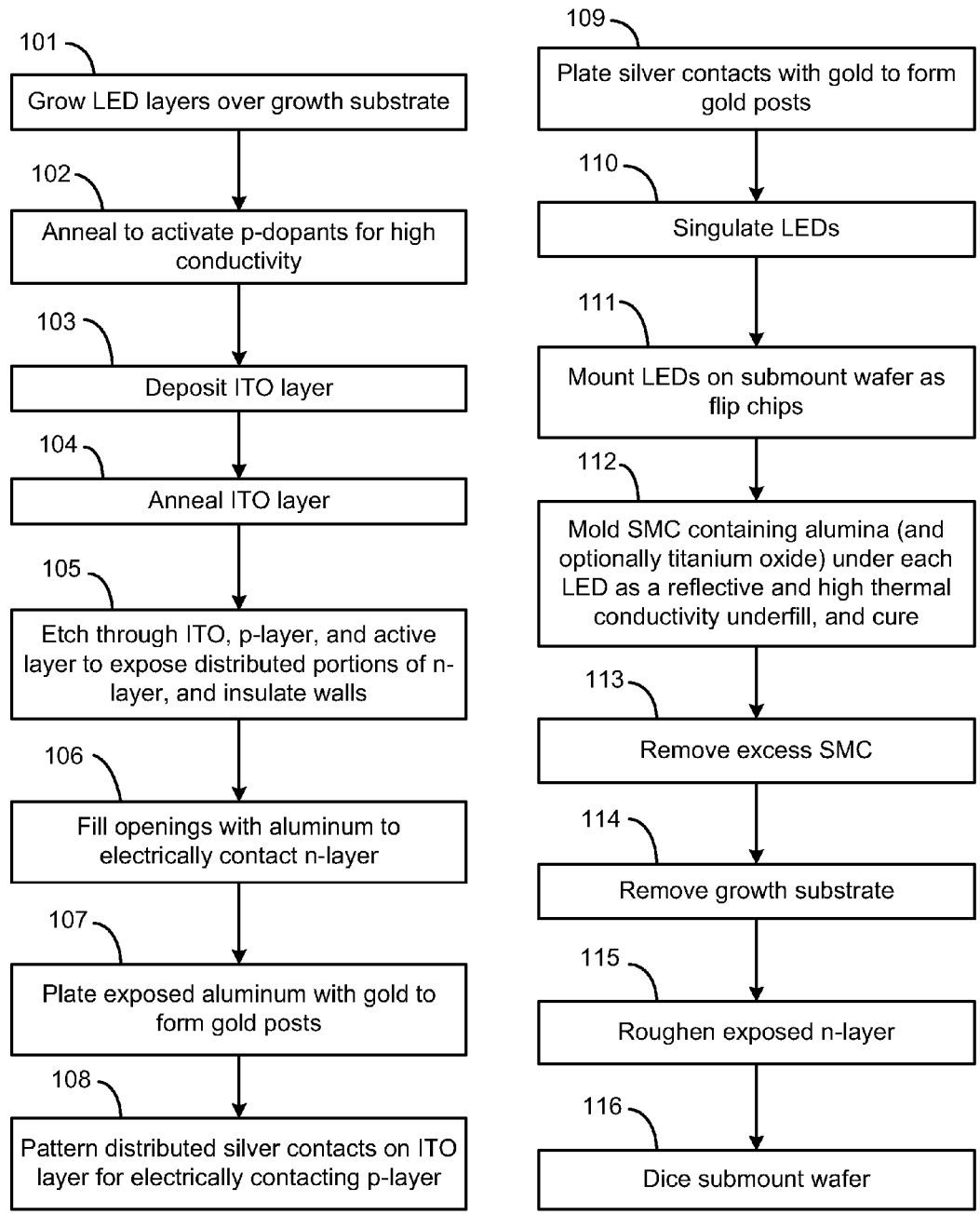
FIG. 12 is a flowchart identifying certain steps used in the process to form the structure of FIG. 10.

Growing the LED layers is shown as step 101 in FIG. 12.

The LED can then be annealed to activate the p-type dopants to increase the conductivity of the p-layers (step 102).

Figure 2:
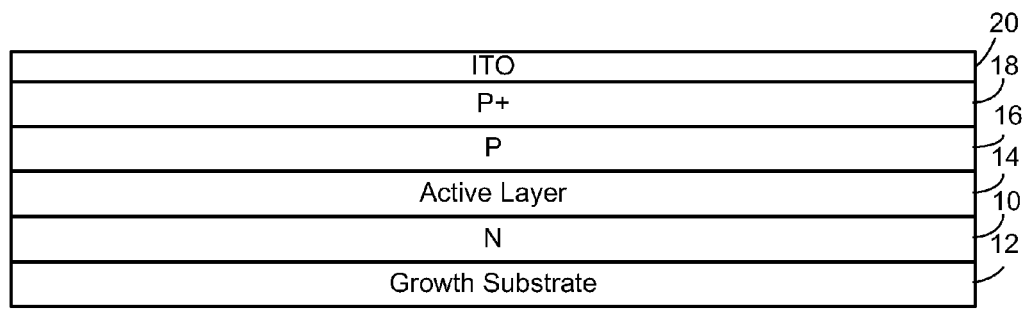
FIG. 2 illustrates an ITO layer deposited over the p-layer for a GaN LED.

As shown in FIG. 2, a thin conductive indium-titanium-oxide (ITO) layer 20 (or other TCO layer) is deposited over the contact layer 18 to help spread current over the contact layer 18 (step 103 in FIG. 12). The thickness maybe on the order of 40 nm-100 nm, although a wide range of thicknesses is acceptable. Depositing ITO layers is well known. Other types of transparent conductive layers may be used instead. The ITO layer 20 will typically absorb less than 2% of the LED light contacting it for wavelengths around 400 nm and has a sheet resistance of about 50 ohms/square for a 40 nm thickness. In contrast, the sheet resistance of the GaN n-layer 10 is about 25 ohms/square. This ITO deposition step would be optional for an AlInGaP LED since the p-layer is more highly conductive. The ITO deposition may also be optional for a GaN-based LED if the p-layer is sufficiently conductive for the spacing between the electrodes.

The ITO layer 20 is then annealed (step 104), if necessary.

Figure 3:
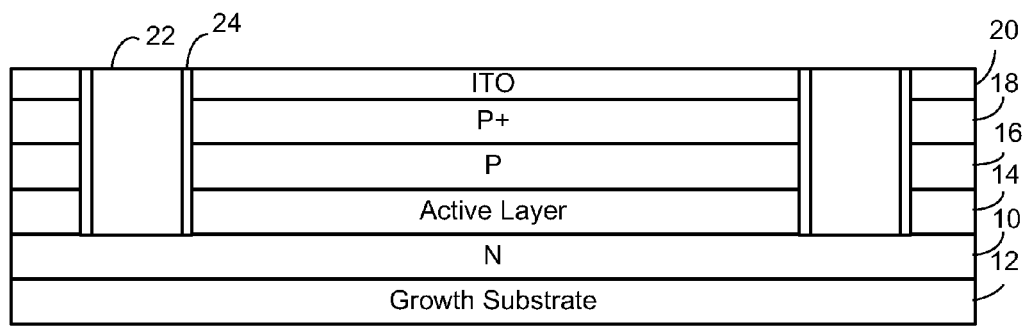
FIG. 3 illustrates openings etched down through to the n-layer and coated with an insulating material.

As shown in FIG. 3, to make the LED a flip-chip, areas 22 of the ITO layer 20, p-layers 18/16, and active layer 14 are selectively etched away using reactive ion etching (RIE), for example, to expose portions of the n-layer 10 for metallization (step 105). In this way, the p contacts and n contacts will be on the same side of the chip and can be directly electrically attached to the submount contact pads. In a flip chip of the configuration shown, current from the n-metal contact initially flows laterally through the n-layer.

An insulating layer 24 (e.g., silicon oxide or silicon nitride) is then deposited on the walls of the openings for electrically insulating the metal from the p-layers and active layer. The insulating layer is optional if the aluminum can be etched to avoid side contact with the p-layer and active layer.

Figure 4:
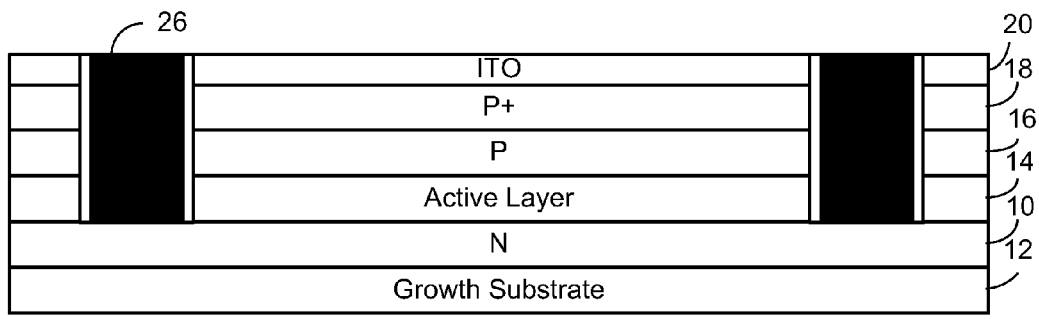
FIG. 4 illustrates the openings filled in with aluminum (or other suitable metal).

As shown in FIG. 4, aluminum 26 (or an Al alloy) is then sputtered into the openings to contact the n-layer 10, and any excess aluminum is removed using well known techniques (step 106). Other suitable metals may be used.

Figure 5:
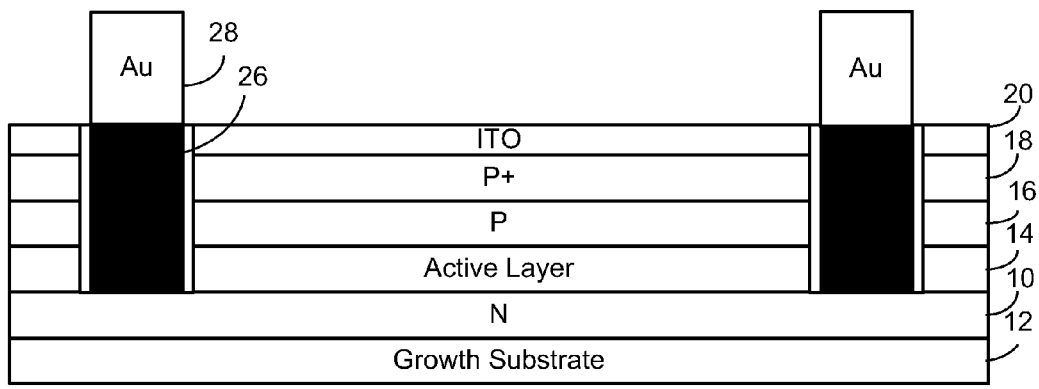
FIG. 5 illustrates areas of the aluminum plated with gold to form posts having a height of about 5 microns, for example.
Figure 11:
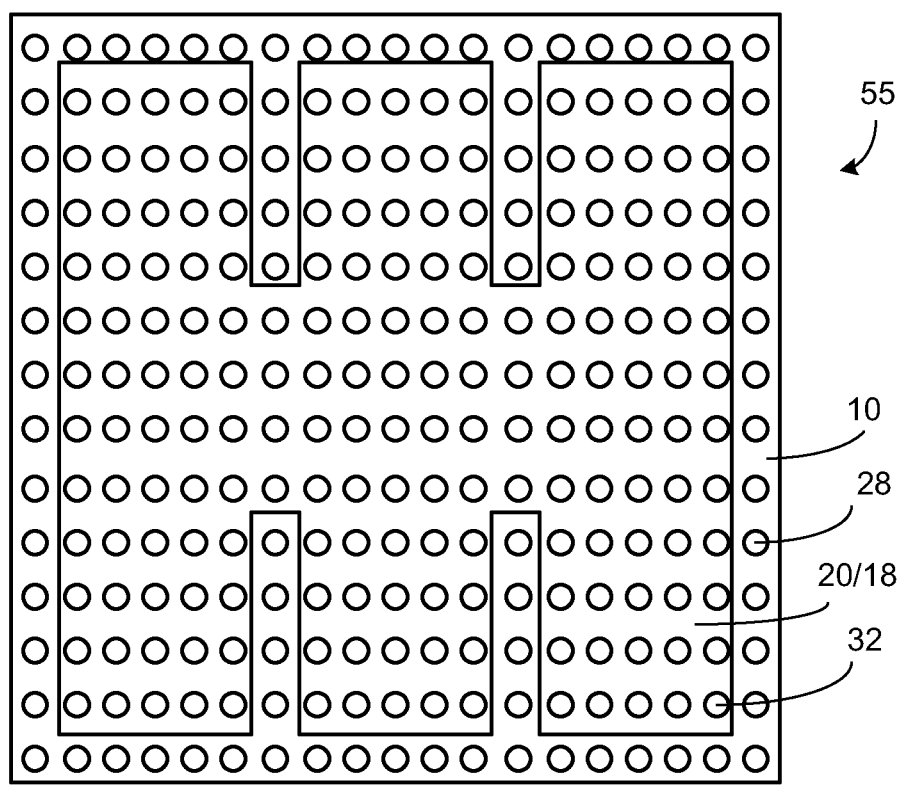
FIG. 11 is a bottom view of the LED of FIG. 10 illustrating the pattern of gold posts contacting the n-layer and p-layer.

As shown in FIG. 5, the top of the LED is selectively masked, the LED wafer is immersed in an electroplating solution with a gold electrode, and the aluminum is electrically biased (via the n-layer 10) to plate the exposed aluminum with gold until gold posts 28 are formed having a height of approximately 5 microns (step 107). Other heights are also suitable. Plating aluminum with gold is a well known process. Suitable barrier layers between the Al and gold may be used. FIG. 11, discussed in detail later, shows one suitable pattern of gold posts 28 on the bottom surface of the LED. In one embodiment, the space between gold posts 28 electrically contacting the n-layer should be less than 200 microns.

Figure 6:
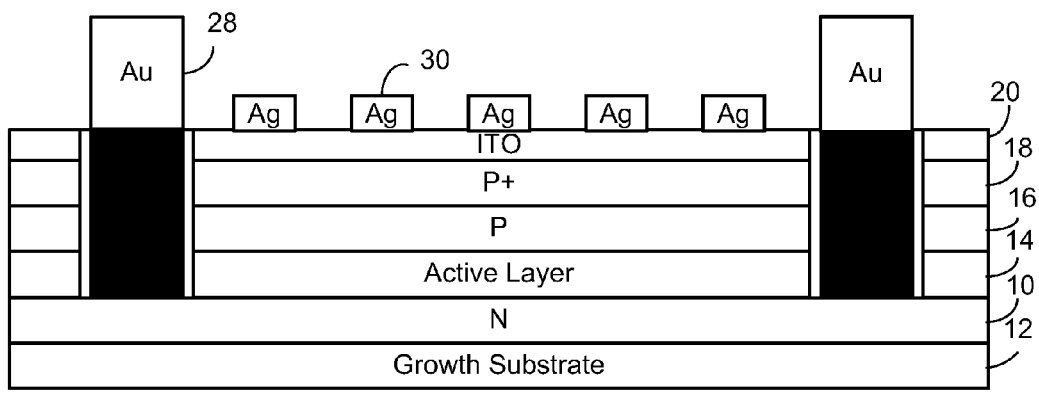
FIG. 6 illustrates silver pads patterned over the ITO layer.

As shown in FIG. 6, silver pads 30 are formed over areas of the ITO layer 20 where gold posts for the p-contact layer 18 are to be formed (step 108). Forming silver pads 30 may be done by sputtering silver followed by a masking and etching process, or a masking and lift-off process may be used. Other techniques can be used. The silver pads 30 may be spaced less than about 50 microns apart, such as about 30 microns, and have a width of about 10-20 microns. Silver is used for maximum reflectivity, and other less reflective metals may also be used.

Figure 7:
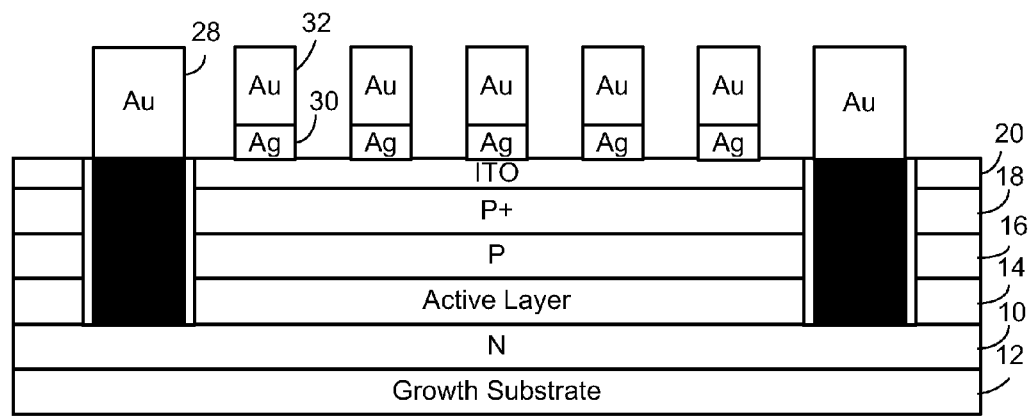
FIG. 7 illustrates gold posts plated over the silver pads to be approximately even with the gold posts over the aluminum.

As shown in FIG. 7, the ITO layer 20 and silver pads 30 are electrically biased while the silver pads 30 are electroplated with gold (similar to step 107) to form gold posts 32 to a height approximately equal to the height of the gold posts 28 (step 109). A barrier layer between the silver and gold may be used, such as TiW or TiWN. The spacing of the gold posts 32 is selected to make the current spreading resistance across the p-contact layer 18 relatively low, since the high density of gold posts 32 in conjunction with the ITO layer 20 may be intended to replace a large silver metal contact from the prior art. The spreading resistance across the top of the p-contact layer 18 should be less than one-third the spreading resistance of the n-layer 10.

If the LED were an AlInGaP LED, direct metal contact to the p-layer by Au/Zn diffusion may be used without the ITO layer, and the Au/Zn areas can then be plated with gold to form the gold posts 32. In this way, the small amount of light absorption by an ITO layer is avoided.

Figure 8:
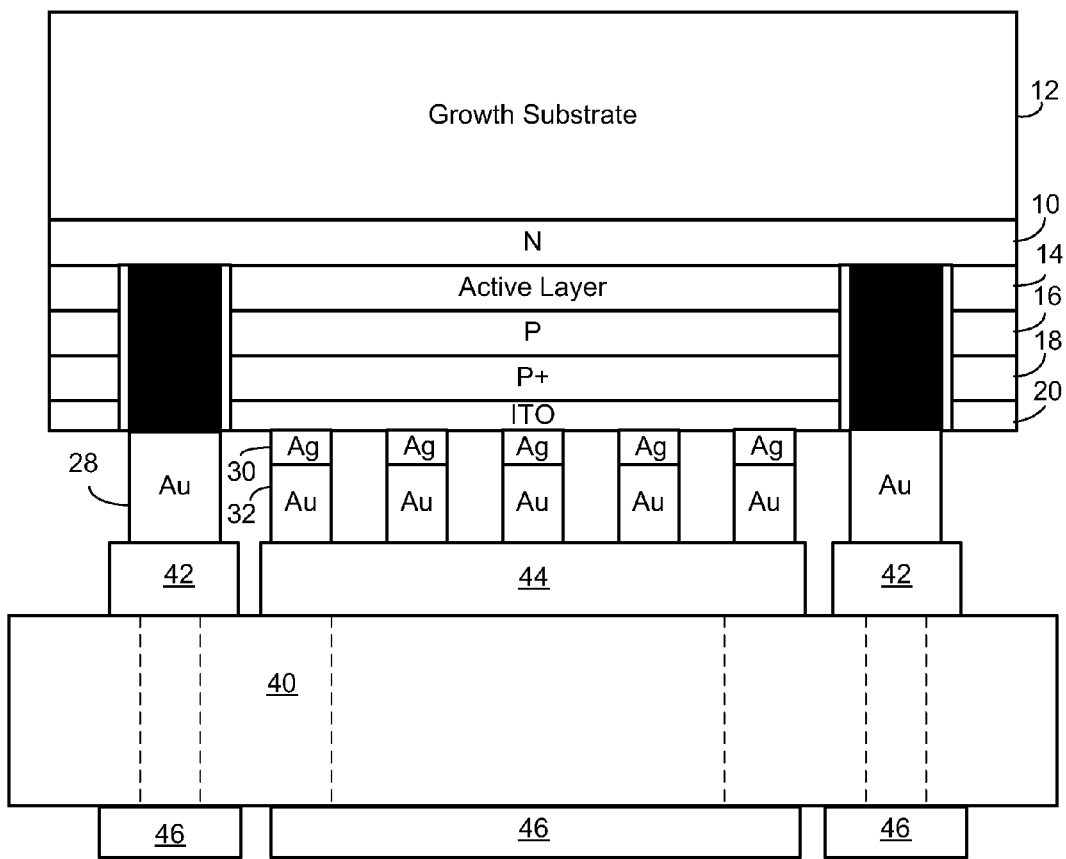
FIG. 8 illustrates a portion of an LED after being diced and mounted on a submount wafer.

As shown in FIG. 8, the LED wafer is singulated (step 110) to separate out the individual LEDs, and the LEDs are mounted on a submount wafer 40 (step 111), which is typically a ceramic wafer. Metal electrodes 42 and 44 on the submount wafer 40 may extend through the wafer (vias are shown in dashed outline) and terminate in bottom contact pads 46 for soldering to a circuit board. In one embodiment, the metal electrodes 42 and 44 are gold, and the LED's gold posts 28 and 32 are ultrasonically welded to the electrodes 42 and 44.

A novel silicone-based underfill is prepared that is reflective and has good thermal conductivity.

Thermal conductivity is defined as the quantity of heat transmitted through a unit thickness in a direction normal to a surface of unit area due to a unit temperature gradient under steady state conditions. Using the Watts/meter/Kelvin (W/m/K) designation is a common way to express thermal conductivity, and the thermal conductivities of most materials are readily available from references.

A conventional silicone molding compound (SMC) contains about 80% silica powder (by weight) for strength. In one embodiment of the invention, the silica (or a portion of it) is replaced with alumina ($Al_2O_3$), where the alumina is prepared using a known process to make the alumina powder white under white light. Such alumina powder is commercially available. Silicone and silica have poor thermal conductivity, such as 1 W/m/K, while alumina has good thermal conductivity, such as 25 W/m/K or more. The silicone loaded with about 80% (by weight) alumina will have a thermal conductivity of about 20 W/m/K.

A small amount (e.g., 5-10% by weight) of the alumina may be substituted with titanium oxide ($TiO_2$), a bright white powder, to increase the reflectance to as high as 96%. Reflectivity of the SMC greater than about 90% is satisfactory. The SMC containing the alumina and $TiO_2$ not only reflect the light but randomize the reflection. Adhesion promoters and solvents may also be added to the SMC to modify the curing properties and viscosity. The coefficient of thermal expansion of the SMC can be close to that of the LED, so that there is little difference in the thermal expansions of the SMC and die under worst case conditions, such as during AuSn or AgSn solder reflow.

Powders other than alumina may be used that have greater thermal conductivity. The reflective properties may be that the materials are white or have a relatively high index of refraction. Such a suitable high index is greater than that of silicone, such as greater than 1.5. A suitable thermal conductivity of a material is greater than 20 W/m/K. Suitable materials may include as AlN, AlON, barium sulfide, barium titanate, aluminium titanate, cubic zirconia, GGG, PLZT, PZT, SiAlON, diamond, silicon carbide, sapphire, certain glass containing heavy metal oxides, SiON, strontium titanate, titanium oxide, YAG, zinc selenide, zinc sulfide, zinc telluride and combinations thereof. The average particle size may be on the order of 5 microns or smaller, including nanoparticles.

To the inventors' knowledge, a silicone molding compound (SMC) has not been previously used (other than by the inventors) as an underfill in an LED or publicly disclosed as an underfill for LEDs. In the preferred embodiment, an SMC is used as the underfill for the following reasons. An SMC is particularly suitable in a molding process (compression or transfer molding) for wafer level underfill of LEDs on the substrate. The SMC is initially (before the molding process) a solid material which can be used in a powder or tablet form for an underfill molding process, which simplifies handling of the material. The standard filler in SMC is the SiO2, which is present in formulation as around 80-90% by weight. The composition of the SMC can be tailored with substitution of some of the filler ($SiO_2$) with $TiO_2$ to obtain high reflectivity white or with $Al_2O_3$, diamond graphite and other such materials to improve thermal conductivity and/or reflectivity, or in some combinations improve both at the same time.

SMC has at least four major advantages over other commonly used underfill materials. First, SMC has a low Young's modulus and during thermal expansion produces low uniform stress on the LED die. Second, SMC can be loaded very heavily with solid material to reduce the coefficient of thermal expansion (CTE) close to that of common metals like copper and gold, reducing differential stress during thermal cycling across the die. Third, SMC is very stable over time with respect to the combination of high intensity blue LED light and high temperature. And fourth, SMC has a very low glass transition temperature (below room temperature), which means that there are no changes in CTE over a typical operating range for LED lights.

In comparison with any epoxy or epoxy molding compound SMC has a very low glass transition temperature (Tg=−10 C). The Tg of the best samples of epoxy molding compound is around Tg=210 C and for the liquid epoxies is around (150 C-170 C). Usually the LED package is attached to the circuit board by using a solder paste at a certain reflow temperature. It can vary from 250 C to 320 C for Pb-free solders. During the solder reflow, the non-SMC underfill material goes from below its Tg to above its Tg. When the reflow temperature goes above the Tg, the polymer transforms from a solid to a plastic stage, which causes an increase of the coefficient of thermal expansion (CTE) and, as a result, the LEDs using such non-SMC materials as an underfill undergo a significant deformation. This deformation can be large enough to plastically deform LED components such as the die and any metal attachment. The plastic deformation does not go back to its original state after the LED is returned to room temperature, putting the LED at risk for reduced operating reliability. This is especially valid for thin film LEDs (total device thickness is around 5um), which are very sensitive to the underfill thermal expansion, since it can cause fatal damage (cracks) to the thin film LEDs. Since the SMC's Tg is below −10 C, and the solid loaded SMC has a low CTE, the SMC underfill does not significantly change its thermal characteristics when going above the reflow temperature (there is no transition from below to above the Tg during the reflow). As a result, the SMC underfill does not create any significant deformation of the underfilled LED structure.

To elaborate on the advantages of SMC summarized above, the first advantage of using an SMC is the relatively low Young's and Bulk modulus of the cured material, which allows much faster material removal around the LEDs after the SMC is molded over the LEDs on the tile and also allows for very low stress on the LED during thermal expansion and contraction.

A second advantage of SMC is its low viscosity and compatibility with many filler materials. Filler materials such as Alumina, Silica, Diamond and graphite are added to the silicone to reduce CTE and to add additional properties such reflectivity and color. White materials are used in systems where white off-state LED color is desired and/or filler material reflectivity can increase system efficiency. Black materials are used where contrast between the LED and the surrounding area is important and other colors can be used for off-state esthetics or other purposes.

A third advantage in using an SMC as an underfill for LEDs is its extremely high stability to the combination of blue photons emitted by blue LEDs and the high temperatures that LEDs are often exposed to. No other group of underfill materials is as stable to the high energy blue photons as SMC. Usually, when using an epoxy underfill, there is a significant polymer degradation around the periphery of the LEDs (including the thin film LEDs). One of the major advantages of LEDs is the long lifetime and, until now, the underfill was one of the critical weakest links in reliability of in particular flip-chip LEDs. SMC brings flip-chip LEDs to an entirely new reliability level enabling higher temperature operation and higher current operation both of which dramatically improve LED lumen per dollar metric.

A fourth advantage is that the low glass transition temperature of SMC gives very stable uniform pressure on the die preventing cracking which is the highest reliability risk for thin-film LEDs.

Accordingly, the use of an SMC as an underfill for an LED, whether or not loaded with the $TiO_2$ or $Al_2O_3$, is considered to be novel and not obvious.

Figure 9:
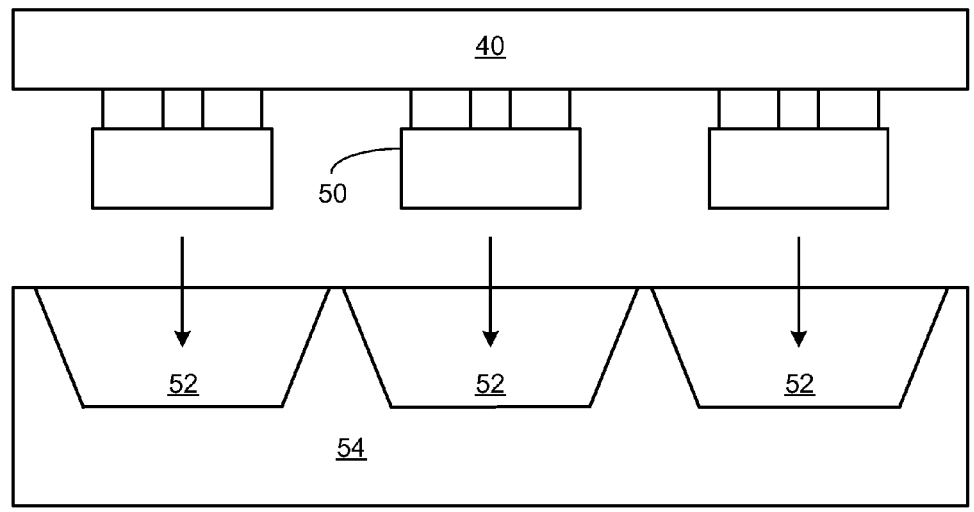
FIG. 9 is a simplified schematic view of three LEDs on the submount wafer being immersed in a silicone molding compound (SMC) containing a powder with good reflectivity and thermal conductivity, such as alumina powder, and optionally $TiO_2$ powder, for compression molding the underfill to fill the voids between the LEDs and the submount wafer.

FIG. 9 is a simplified schematic diagram of a portion of the submount wafer 40 showing three LEDs 50 undergoing a compression molding process to fill the voids between the LEDs 50 and the submount wafer 40 (step 112) with the SMC 52 (containing alumina and optionally $TiO_2$). The SMC 52 may be deposited into the mold 54 indentions as a liquid or a dry powder. If a dry powder is used, the mold 54 is heated to melt the powder. The submount wafer 40 is then bought against the mold 54 and pressed down to compress the SMC 52 to cause the SMC 52 to fill all the voids under the LEDs and push all the air out. Typically, there is a seal around the periphery of the mold/wafer. Instead of compression molding, injection molding may be used, although injection molding may exert more force on the delicate gold posts.

The SMC 52 is then cured (hardened), such as by cooling, heating, or UV light, depending on the type of silicone used, and the submount wafer 40 is removed from the mold 54. Excess SMC 52, such as over the growth substrate 12, can then be removed by microbead blasting (step 113).

Figure 10:
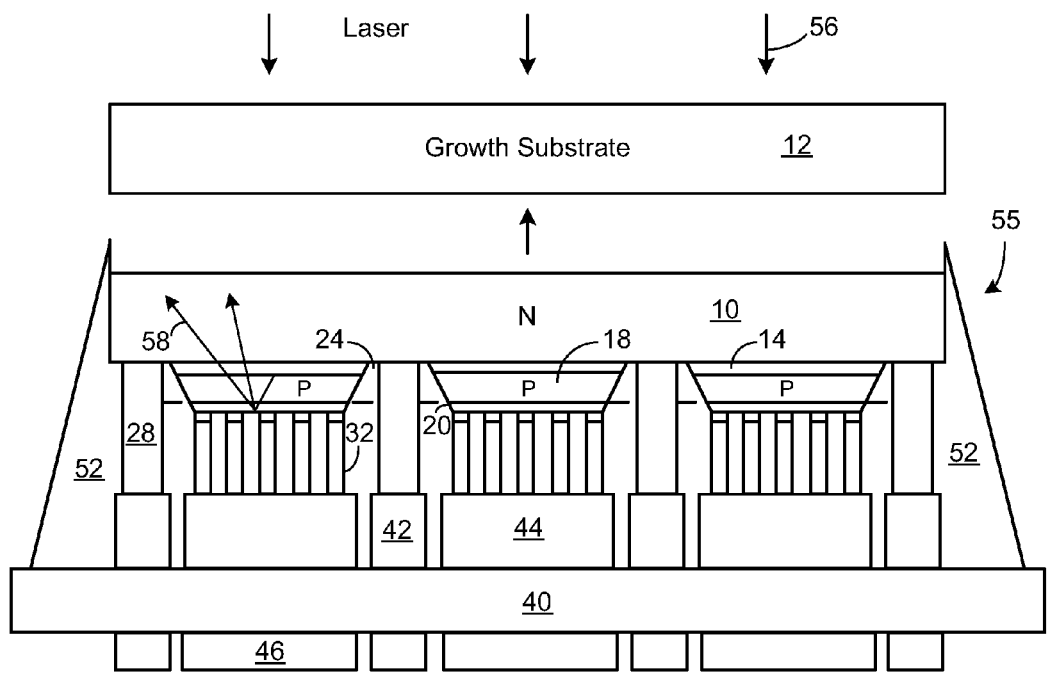
FIG. 10 illustrates, with more detail, a complete LED as the growth substrate is being removed by laser lift-off. The molded underfill and gold posts support the LED layers during the laser lift-off.

FIG. 10 illustrates one complete LED 55 on the submount wafer 40 undergoing an optional laser lift-off process for removing the growth substrate 12 (step 114). In a laser lift-off process, excimer laser energy 56 breaks the GaN bonds at the surface of the n-layer 10, and the released gas pressure pushes the growth substrate 12 off the n-layer 10. There is a high pressure on the LED layers during laser lift-off, and the distributed gold posts 28/32 and SMC 52 mechanically support the LED layers. The LED layers are typically less than 50 microns thick. The delaminated growth substrate 12 is then removed such as by an adhesive sheet.

The exposed n-layer 10 is then etched to remove any surface damage and optionally roughen the layer to increase light extraction (step 115).

A light ray 58 is shown being emitted by the active layer 14 of the LED 55 and reflected generally upward at scattered angles due to the alumina and/or $TiO_2$ particles in the SMC 52. The light can actually enter the SMC 52 some small distance before being sufficiently reflected by the alumina and $TiO_2$ powder. The tops of the gold posts 32 will also reflect light. The heat generated by the LED 55 is efficiently coupled to the submount wafer 40 via the SMC 52, gold posts 28/32, and submount electrodes 42/44.

In the example provided above, the SMC 52 is about 5 microns thick and can result in a thermal resistance of only 0.25 K/W between the LED 55 and the submount electrodes 42/44. The LED 55 has a bottom surface area on the order of 1 $mm^2$.

Other wafer-level processes may also be performed on the LED array while mounted on the submount wafer 40, such as a wafer scale molding of lenses. Phosphor may also be deposited over the LEDs for converting blue LED light into white light.

The submount wafer 40 is then diced to separate out the individual LEDs/submounts (step 116). FIG. 10 may illustrate the separated LED/submount. The bottom submount electrodes 46 may then be soldered to a metal core heat sink circuit board.

FIG. 11 is a back view of a single LED 55 showing the etched away areas where electrical contact is made to the n-layer 10 via the gold posts 28 and aluminum. The center area is where the ITO layer 20 is formed over the p-contact layer 18 and the gold posts 32 are distributed over the ITO layer 20. The metal electrodes 42/44 on the surface of the submount generally coincide with the shapes of the exposed n-layer 10 and p-contact layer 18. The conductivities of the layers may be reversed.

The device need not be a flip chip and can be a vertical device (with a top electrode) with metal posts contacting the bottom n or p-layer and interconnected to the submount with the disclosed underfill. Electrical contact to the top electrode of the die can be made with a wire or ribbon bond.

Many of the steps in FIG. 12 are optional or only examples.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a light emitting diode (LED) die, the LED die having a bottom surface;
   a submount on which the LED die is mounted, there being a gap between the LED die and the submount;
   the LED die having a plurality of metal posts electrically connected to the bottom surface, there being substantially transparent areas between the metal posts along a bottom surface of the LED die so that light emitted downward by the LED die passes between the metal posts; and
   a substantially reflective underfill material filling voids between the bottom surface of the LED die and the submount, the underfill material comprising silicone and a reflective powder having a thermal conductivity greater than 20 W/m/K, the underfill material reflecting light from the LED die generally upward and conducting heat between the LED die and the submount
   wherein the underfill material further comprises silicone infused with TiO2, wherein the TiO2 comprises more than about 5%, by weight, of the underfill material.

2. The device of claim 1, wherein the reflective underfill material diffusively reflects light from the LED die.

3. The device of claim 1, wherein the underfill material comprises a silicone molding compound having a glass transition temperature below room temperature.

4. A light emitting device comprising:
   a light emitting diode (LED) die, the LED die having a bottom surface;
   a submount on which the LED die is mounted, there being a gap between the LED die and the submount;
   the LED die having a plurality of metal posts electrically connected to the bottom surface, there being substantially transparent areas between the metal posts along a bottom surface of the LED die so that light emitted downward by the LED die passes between the metal posts; and
   a substantially reflective underfill material filling voids between the bottom surface of the LED die and the submount, the underfill material comprising silicone and a reflective powder having a thermal conductivity greater than 20 W/m/K, the underfill material reflecting light from the LED die generally upward and conducting heat between the LED die and the submount wherein the reflective powder comprises alumina being at least 70%, by weight, of the underfill material.

5. The device of claim 4, wherein the reflective underfill material diffusively reflects light from the LED die.

6. The device of claim 4, wherein the underfill material comprises a silicone molding compound having a glass transition temperature below room temperature.

7. A light emitting device comprising:
- a light emitting diode (LED) die, the LED die having a bottom surface;
- a submount on which the LED die is mounted, there being a gap between the LED die and the submount;
- the LED die having a plurality of metal posts electrically connected to the bottom surface, there being substantially transparent areas between the metal posts along a bottom surface of the LED die so that light emitted downward by the LED die passes between the metal posts; and
- a substantially reflective underfill material filling voids between the bottom surface of the LED die and the submount, the underfill material comprising silicone and a reflective powder having a thermal conductivity greater than 20 W/m/K, the underfill material reflecting light from the LED die generally upward and conducting heat between the LED die and the submount wherein the underfill material has a reflectivity of at least 90%, for visible light, and a thermal conductivity of at least about 20 W/m/K.

8. The device of claim 7 wherein the LED die is a flip chip.

9. The device of claim 7 wherein the metal posts are spaced less than 50 microns apart.

10. The device of claim 7 wherein the LED die has a p-type layer facing the submount, the device further comprising a non-semiconductor substantially transparent conductive layer over the p-type layer and between the p-type layer and the metal posts.

11. The device of claim 7 wherein the LED die has a p-type layer facing the submount, wherein the metal posts are gold posts plated over the p-type layer.

12. The device of claim 7 wherein the LED die has a p-type layer facing the submount, the device further comprising:
- a non-semiconductor substantially transparent conductive layer over the p-type layer;
- metal pads deposited over the substantially transparent conductive layer; and
- wherein the metal posts comprise gold posts plated over the metal pads.

13. The device of claim 7 wherein the metal posts are between 3-7 microns long.

14. The device of claim 7 further comprising one set of metal posts electrically contacting a p-type layer in the LED die and another set of metal posts electrically contacting an n-type layer in the LED die.

15. The device of claim 7 wherein the metal posts have a thickness between 10-20 microns and are spaced less than 50 microns apart.

16. The device of claim 7 wherein the reflective underfill material diffusively reflects light from the LED die.

17. The device of claim 7 wherein a growth substrate for the LED die has been removed.

18. The device of claim 7, wherein the underfill material comprises a silicone molding compound having a glass transition temperature below room temperature.

19. The device of claim 7, wherein the underfill material comprises a silicone molding compound having a glass transition temperature below room temperature.

\* \* \* \* \*